(12) United States Patent
Kato et al.

(10) Patent No.: US 10,586,676 B2
(45) Date of Patent: Mar. 10, 2020

(54) CHARGED PARTICLE BEAM DEVICE

(71) Applicant: Hitachi High-Technologies Corporation, Tokyo (JP)

(72) Inventors: Takanori Kato, Tokyo (JP); Motohiro Takahashi, Tokyo (JP); Shuichi Nakagawa, Tokyo (JP); Hironori Ogawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/099,494

(22) PCT Filed: Jun. 14, 2017

(86) PCT No.: PCT/JP2017/021905
§ 371 (c)(1),
(2) Date: Nov. 7, 2018

(87) PCT Pub. No.: WO2018/003493
PCT Pub. Date: Jan. 4, 2018

(65) Prior Publication Data
US 2019/0108970 A1 Apr. 11, 2019

(30) Foreign Application Priority Data
Jun. 27, 2016 (JP) ................... 2016-126167

(51) Int. Cl.
*H01J 37/00* (2006.01)
*H01J 37/147* (2006.01)
(Continued)

(52) U.S. Cl.
CPC ............ *H01J 37/147* (2013.01); *H01J 37/20* (2013.01); *H01J 37/22* (2013.01); *H01J 37/28* (2013.01);
(Continued)

(58) Field of Classification Search
CPC .......... H01J 37/147; H01J 37/20; H01J 37/22; H01J 37/28; H01J 2237/2809; H01J 2237/26
(Continued)

(56) References Cited

U.S. PATENT DOCUMENTS

| | | | | |
|---|---|---|---|---|
| 2005/0056784 | A1* | 3/2005 | Subramaniam | G01N 23/04 250/311 |
| 2016/0019696 | A1* | 1/2016 | Morita | G06T 7/32 348/80 |
| 2016/0365219 | A1* | 12/2016 | Nishioka | H01J 37/20 |

FOREIGN PATENT DOCUMENTS

| | | | |
|---|---|---|---|
| JP | 59-063649 A | 4/1984 | |
| JP | H036616 B2 * | 1/1991 | ............. H01J 37/28 |

(Continued)

OTHER PUBLICATIONS

International Search Report of PCT/JP2017/021905 dated Sep. 12, 2017.

*Primary Examiner* — Michael Maskell
(74) *Attorney, Agent, or Firm* — Mattingly & Malur, PC

(57) ABSTRACT

An object of the present invention is to provide a charged particle beam device capable of correcting an image drift caused by stage deformation or the like during imaging immediately after stage movement. In order to achieve the above object, proposed is a charged particle beam device including: a sample chamber; a sample stage arranged in the sample chamber; a charged particle beam source which releases a charged particle beam; a deflector which deflects the charged particle beam released from the charged particle beam source; a focusing lens which focuses the charged particle beam; and a control device that controls the sample stage and the deflector, in which the control device calculates a deflection signal to be supplied to the deflector based (Continued)

on a thrust information when driving of the sample stage and a coefficient assigned for each position of the sample stage.

3 Claims, 12 Drawing Sheets

(51) Int. Cl.
  *H01J 37/20* (2006.01)
  *H01J 37/22* (2006.01)
  *H01J 37/28* (2006.01)
(52) U.S. Cl.
  CPC ... *H01J 2237/26* (2013.01); *H01J 2237/2809* (2013.01)
(58) Field of Classification Search
  USPC .......... 250/306, 307, 310, 311, 492.1–492.3
  See application file for complete search history.

(56) References Cited

FOREIGN PATENT DOCUMENTS

| | | | | |
|---|---|---|---|---|
| JP | 2007-042514 | A | 2/2007 | |
| JP | 2014-093153 | A | 5/2014 | |
| JP | 2015-026553 | A | 2/2015 | |
| JP | 2015-046331 | A | 3/2015 | |
| JP | 2015-210999 | A | 11/2015 | |
| WO | WO-2015129292 | A1 * | 9/2015 | .............. H01J 37/20 |

\* cited by examiner

FIG. 3
(a) DURING STAGE MOVEMENT
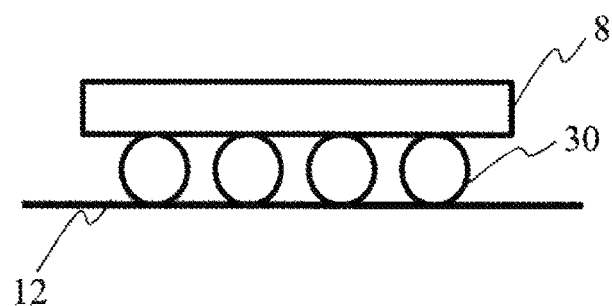
(b) AFTER STAGE MOVEMENT
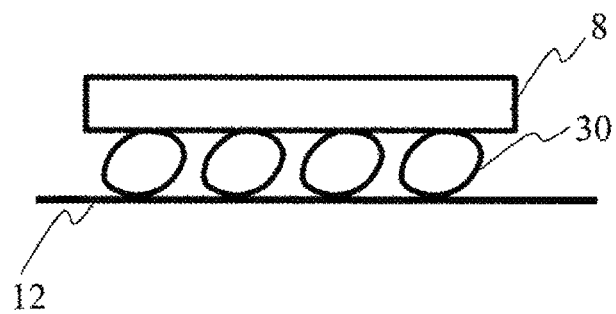

FIG. 4
(a) THERE IS NO MIRROR DEFORMATION
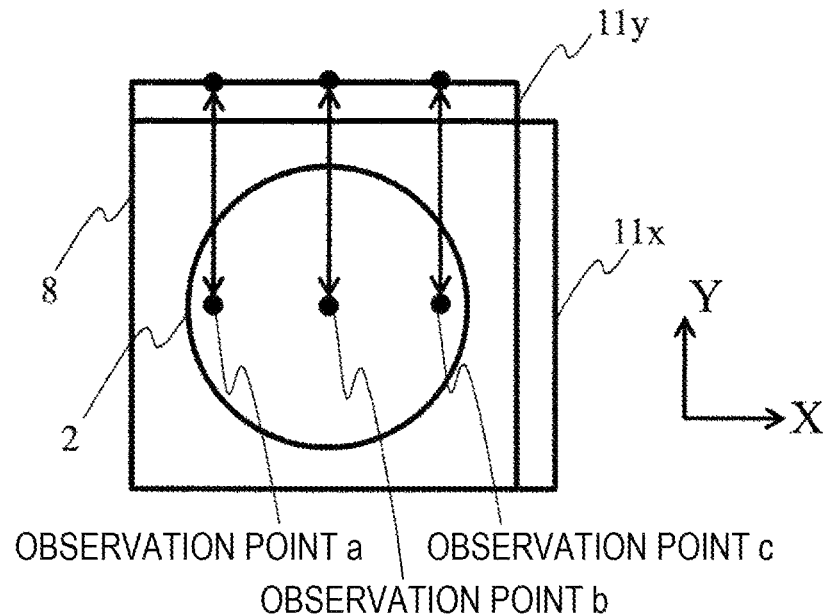
(b) THERE IS MIRROR DEFORMATION
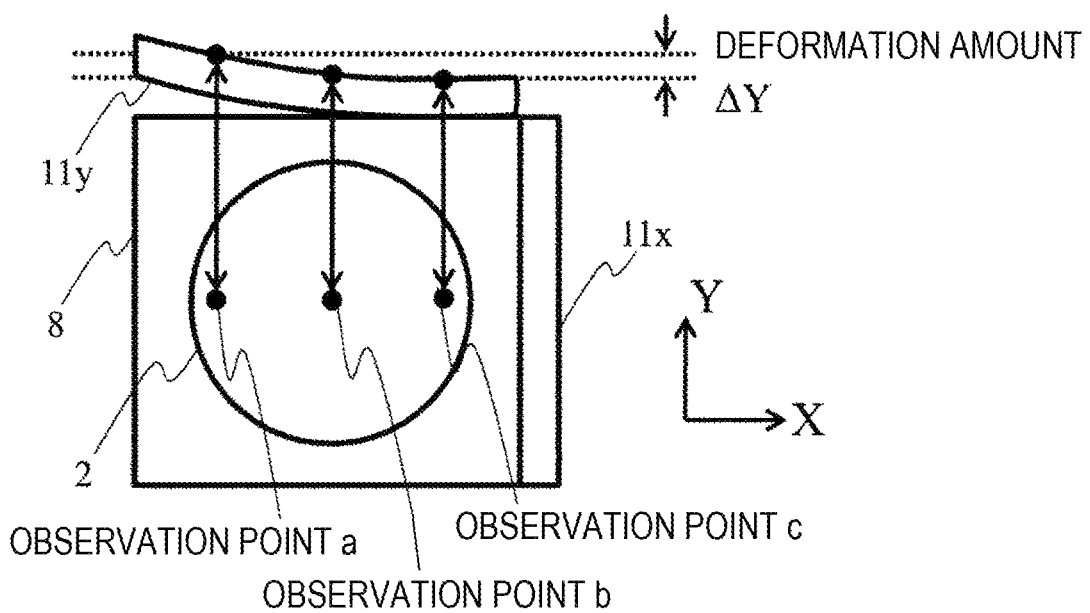

FIG. 5
(a) THERE IS NO WAFER DEFORMATION
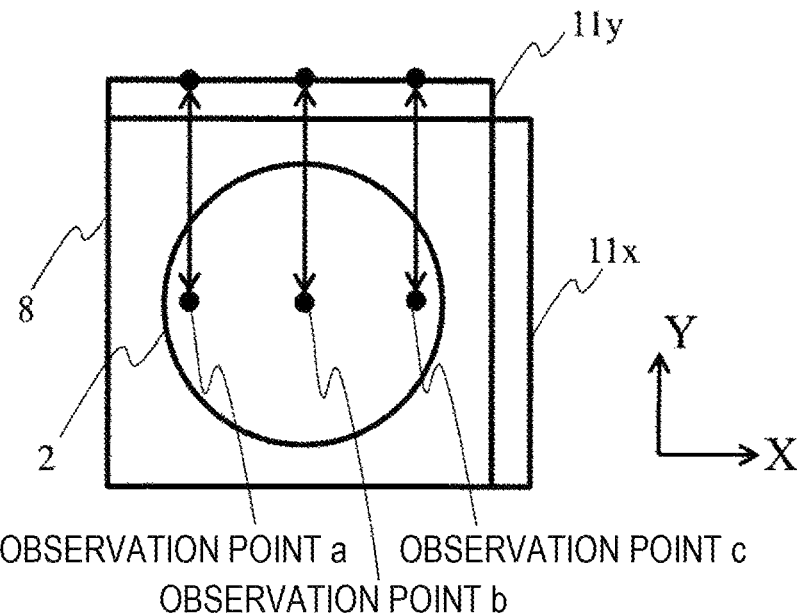
(b) THERE IS WAFER DEFORMATION
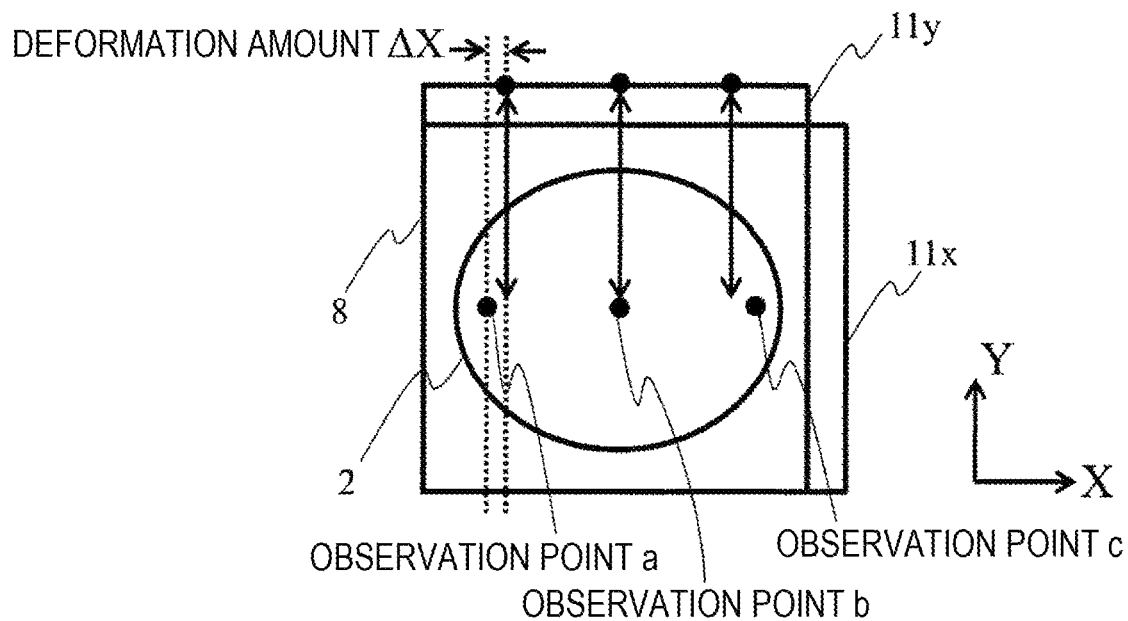

FIG. 6
(a) THERE IS NO IMAGE DRIFT
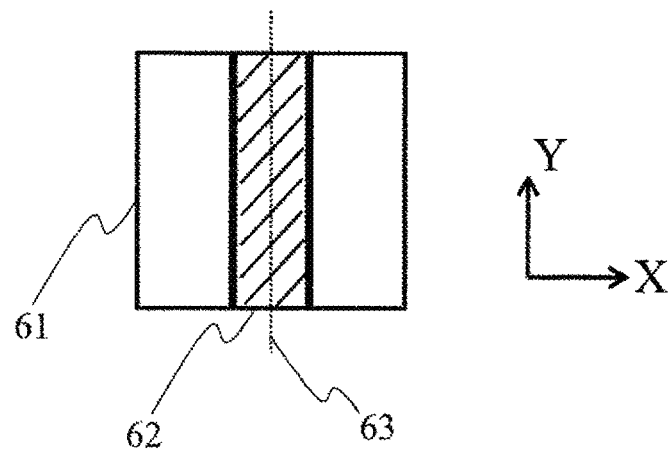
(b) THERE IS IMAGE DRIFT
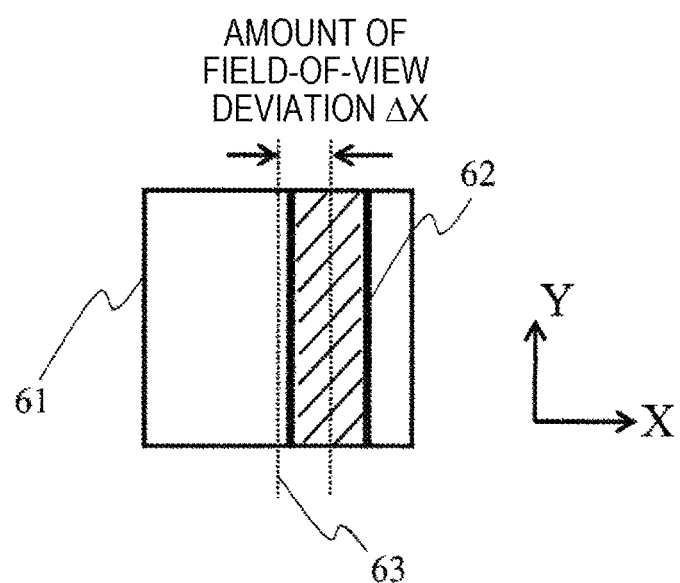

FIG. 7
(a) STAGE THRUST
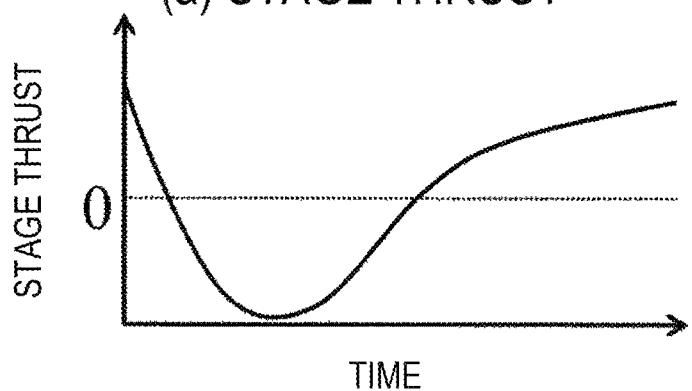
(b) IMAGE DRIFT
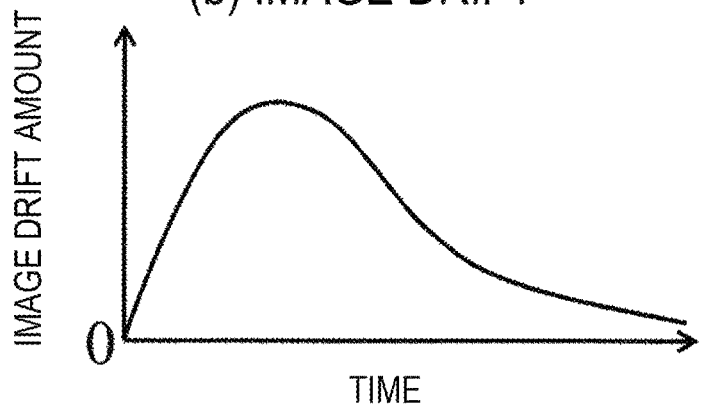
(c) STAGE THRUST-IMAGE DRIFT CHARACTERISTICS
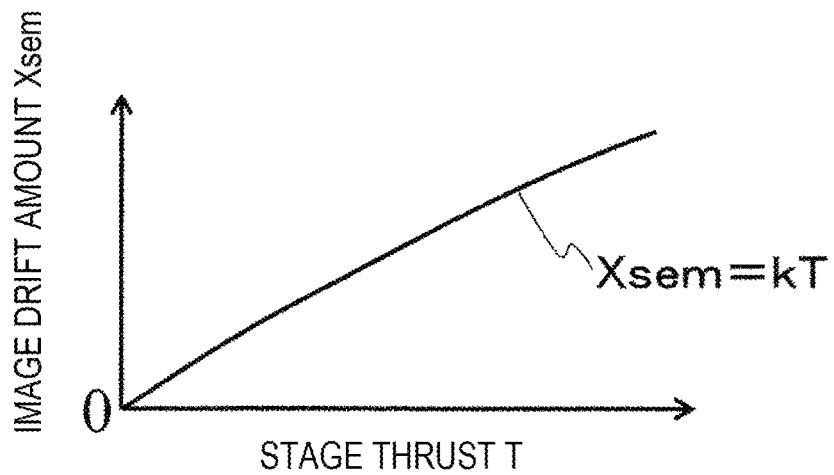

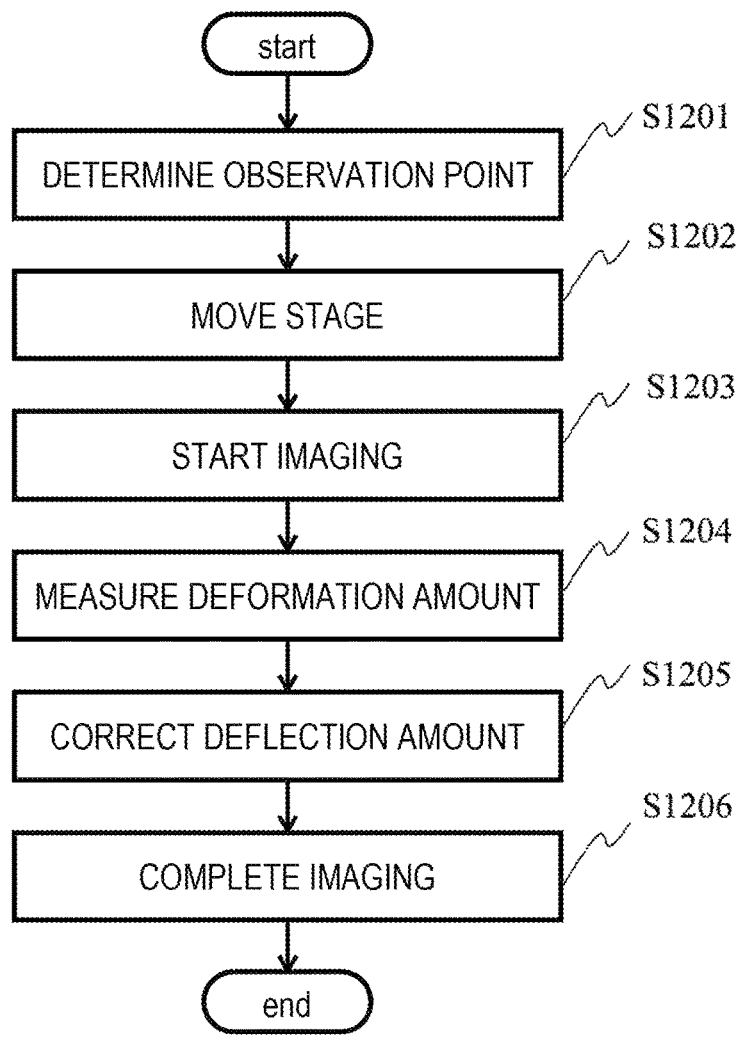

CHARGED PARTICLE BEAM DEVICE

TECHNICAL FIELD

The present disclosure relates to a charged particle beam device, and particularly to a charged particle beam device that effectively suppresses an image deviation generated at the time of acquiring an image.

BACKGROUND ART

Charged particle beam devices typified by an electron microscope are used as a device configured to observe a fine object. Among them, a charged particle beam device that measures a pattern formed on a semiconductor wafer or inspects a defect is provided with a stage having a large size in X Y directions along with a size increase of the semiconductor wafer. Meanwhile, a charged particle beam device used for process management and the like in a mass production process of semiconductor devices is required to have high throughput. In order to realize the high throughput, it is desirable to perform beam irradiation for measurement or inspection immediately after stage movement, but there is a case where it is difficult to irradiate a proper position with a beam due to an image deviation (drift) generated after the stage movement.

PTL 1 describes a method of obtaining a cross correlation function between two images by image processing of a reference image and a comparative image which are acquired in advance and calculating an image drift by searching a maximum intensity position of the cross-correlation function. According to this method, it is possible to accurately calculate an image drift amount in accordance with a shifted period even in the case of a sample having a periodic structure such as an atomic arrangement.

PTL 2 discloses a stage device including a laser measurement system capable of identifying a position of a stage. In a stage device disclosed in PTL 2, a method of correcting a beam irradiation position in accordance with position identification using a laser measurement system for a problem that a stop position drifts due to thermal expansion caused by a thermal change of a ball screw forming the stage, a change of friction of a contact surface of an ultrasonic motor, and the like.

CITATION LIST

Patent Literature

PTL 1: JP 2015-210999 A
PTL 2: JP 2007-42514 A

SUMMARY OF INVENTION

Technical Problem

According to the methods disclosed in PTL 1 and PTL 2, a drift amount is obtained based on the image processing or the identification of the position of the stage. However, since the drift amount is calculated based on an obtained image and measurement value, it is difficult to obtain a sufficient correction effect because a correction delay of the drift amount occurs when the drift amount changes with time along with stage deformation. Further, since the temporal change of the image drift depends on a moving distance and a moving direction of the stage, a wafer measurement point, and the like, it is also difficult to predict and correct a change amount of the drift from image information. In addition, there is no statement regarding a correction method of an SEM image at the time of stage deformation.

Hereinafter, proposed is a charged particle beam device aimed at correcting an image drift caused by stage deformation or the like during imaging immediately after stage movement.

Solution to Problem

Hereinafter, as an aspect to achieve the above object, proposed is a charged particle beam device including: a sample chamber; a sample stage arranged in the sample chamber; a charged particle beam source which releases a charged particle beam; a deflector which deflects the charged particle beam released from the charged particle beam source; a focusing lens which focuses the charged particle beam; and a control device that controls the sample stage and the deflector, in which the control device calculates a deflection signal to be supplied to the deflector based on a thrust information when driving of the sample stage and a coefficient assigned for each position of the sample stage.

Advantageous Effects of Invention

According to the above configuration, it is possible to acquire an image with no drift even immediately after stage movement.

BRIEF DESCRIPTION OF DRAWINGS

FIG. 3 is a schematic view illustrating a state of a rolling element of a linear guide.

FIG. 4 is a schematic view illustrating deformation of a mirror.

FIG. 5 is a schematic view illustrating deformation of a wafer.

FIG. 6 is a schematic view illustrating an image drift.

FIG. 7 is a schematic view illustrating a relationship between a stage thrust and the image drift.

FIG. 12 is a flowchart illustrating a deflection amount correction process using a sensor.

FIG. 13 is a view illustrating an example of a correction coefficient table configured to correct an irradiation position of a charged particle beam.

DESCRIPTION OF EMBODIMENTS

Figure 1:
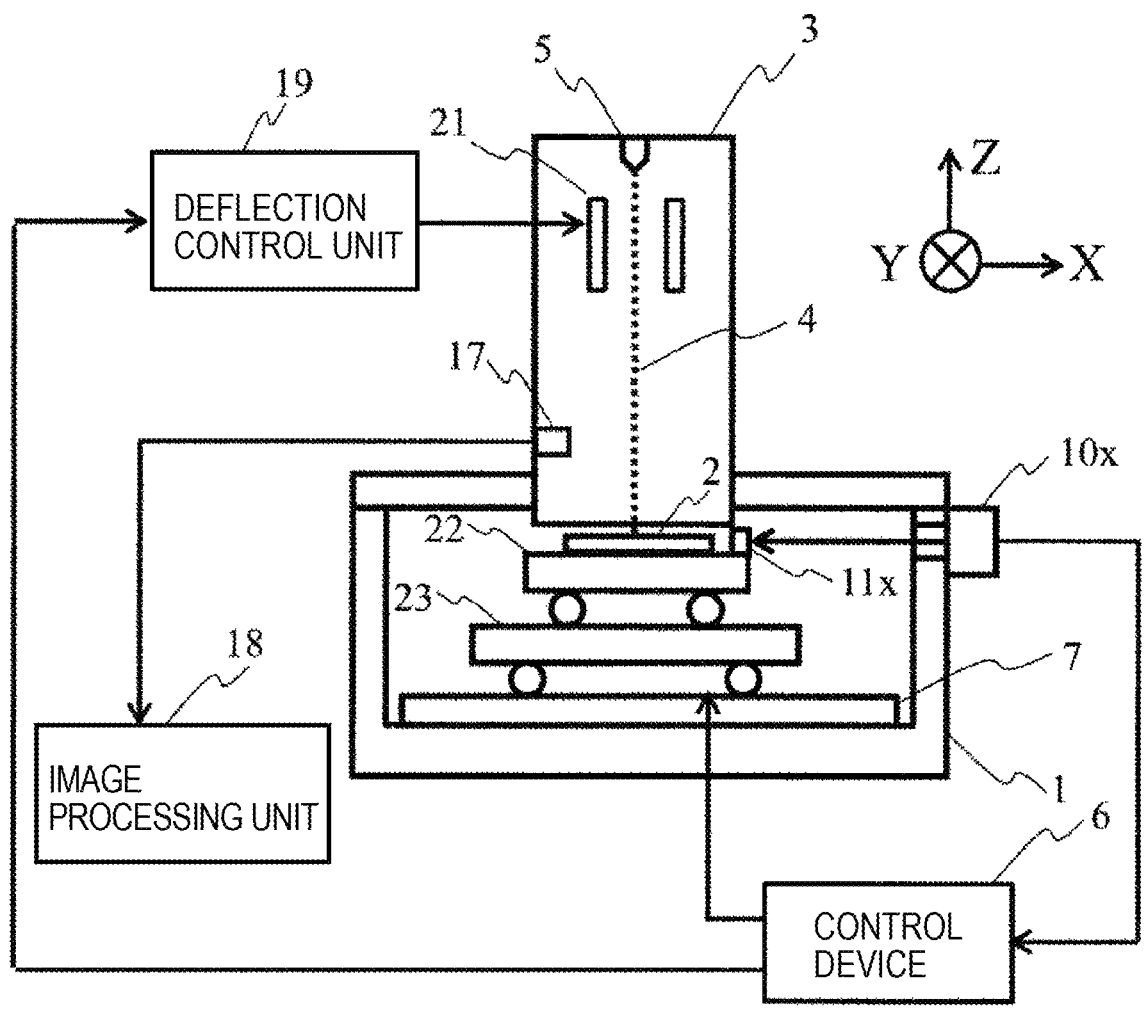
FIG. 1 is a cross-sectional view of a charged particle beam device.

Along with miniaturization of semiconductor devices, not only manufacturing devices but also inspection and evaluation devices are required to have high precision to deal with the miniaturization. In general, a scanning electron microscope (SEM) is used for evaluation of a pattern formed on a semiconductor wafer and inspection of a defect on the formed wafer. In particular, a critical dimension SEM is used in the case of evaluating geometry of a pattern.

Critical dimension SEM is a device that irradiates a wafer with an electron beam and performs image processing of a secondary electron signal thus obtained to determine an edge of a pattern based on a change in light and darkness and measure a size and the like. In order to deal with the semiconductor miniaturization, it is important to obtain a secondary electron image with less noise at a high observation magnification. Thus, it is necessary to improve a contrast by superimposing a plurality of secondary electron images on each other. In addition, in order to accurately measure a fine pattern to be evaluated, it is necessary to accurately position a field of view of the electron microscope on the pattern to be evaluated. Thus, a characteristic pattern existing in the vicinity of the pattern to be evaluated is found by a matching process using a template prepared in advance, and field-of-view alignment is performed on the pattern to be evaluated in a known positional relationship with the characteristic pattern (hereinafter referred to as addressing).

In the critical dimension SEM, generally, XY stages capable of positioning a desired measurement point on a wafer at an irradiation position of an electron beam is arranged in order to observe and inspect the entire wafer. In the XY stage device, an X table and a Y table are guided by a linear guide and moved in the X direction and the Y direction, respectively, with respect to a sample chamber by driving a driving mechanism such as a linear motor. A bar mirror is arranged on the XY tables, and a stage position is detected using a position detector such as a laser interferometer to form a servo control system. The detected stage position information is fed back to an electron optical system scanning the electron beam to correct a deflection amount of the electron beam so that the electron beam can follow stage vibration and a positional deviation of the stage can be corrected.

In the SEM, it is preferable to start imaging with the electron optical system immediately after completion of stage movement and acquire an SEM image in order to improve throughput of the wafer inspection and measurement. However, the stage is not completely stopped immediately after stage movement, and the stage moves by about several tens to several hundreds of nanometers while a rolling element of the linear guide is elastically deformed. Since servo control is performed so as to stop the XY stages at a desired observation point, a linear motor thrust to be applied to the stage fluctuates along with a change of the stage position caused by the elastic deformation of the linear guide. At this time, as a minute linear motor thrust is applied to the table, elastic deformation on the order of several nanometers occurs in the bar mirror and the wafer on the table to change a relative positional relationship between the bar mirror and the measurement point on the wafer.

When positioning the stage is performed using such laser position information, it is difficult to accurately position the measurement point on the wafer at the beam irradiation position, and there occurs a field-of-view deviation corresponding to the change in the relative positions of the mirror and the wafer from a field-of-view center aligned by the addressing. In addition, when a plurality of images is successively captured and the respective images are accumulated, an image drift in which the amount of field-of-view deviation differs between an initial image and the subsequent images occurs with a temporal change of the relative positions of the wafer measurement point and the bar mirror, which leads to image disturbance such as image blur.

With studies conducted by the inventors, it has been clarified that there is a case where the above image drift changes depending on a moving direction of the stage and stage coordinates and it is possible to suppress the drift by performing appropriate drift correction in accordance with the moving direction and stage coordinates. In embodiments to be described below, a description will be given regarding a charged particle beam device including a stage device capable of performing drift correction in accordance with a moving direction and stage coordinates based on thrust information of a stage.

In the embodiments to be described below, mainly proposed is a charged particle beam device including: a sample chamber; a sample stage arranged in the sample chamber; a charged particle beam source installed on the top of the sample stage; a deflection means (deflector) which deflects a charged particle beam; an optical system column having a focusing lens which focuses the charged particle beam; and a control device which controls the optical system column and the sample stage, in which the control device corrects an irradiation position of the charged particle beam using thrust information when driving of the sample stage and table information assigned for each combination of a moving direction of the stage and stage coordinates.

According to the above configuration, it is possible to perform the highly accurate irradiation position correction regardless of deformation of a table, a mirror, and a wafer after movement of the stage. In the embodiments to be described below, in view of the fact that the displacement of the irradiation position varies depending on the moving direction of the stage, the stage coordinates, and a stage thrust, an irradiation position correction value (a deflection amount and a deflection direction of a beam) is derived in accordance with such conditions so that it is possible to acquire a high-resolution SEM image with no image disturbance such as the image drift caused by stage deformation. In addition, it is possible to perform imaging immediately after stage movement without setting a standby time for imaging, which contributes to improvement in device throughput.

The embodiments to be described below relate to a charged particle beam device such as an SEM and image drift correction of an image acquired by the SEM.

First Embodiment

FIG. 1 is a cross-sectional view of a charged particle beam device according to the present embodiment. In FIG. 1, an X stage 22 and a Y stage 23 are mounted on a base 7 fixed in a sample chamber 1. A laser interferometer 10x and a mirror 11x configured to measure an X direction position of the table is installed on the XY stages. The X laser interferometer 10x irradiates the mirror 11x with a laser beam and measures a relative displacement amount (hereinafter referred to as an X-laser value) in the X direction between the sample chamber 1 and the X table using the reflected light. The X-laser value is fed back to a control device 6 to form a servo control system for the X direction.

For the Y direction, similarly, a relative displacement in the Y direction of the X table is detected using a laser interferometer (not illustrated) to form a servo control system. Accordingly, the X table is positioned at a desired position in the X and Y directions, and inspection and measurement are performed for the entire surface on a wafer 2.

In the sample chamber 1, a column 3 holding an electron optical system is arranged. The column 3 is provided with an electron gun 5 configured to generate a secondary electron image by an electron beam 4. Generated secondary electrons are detected by a secondary electron detector 17. A secondary electron signal detected by the secondary electron detector 17 is input to an image processing unit 18 to be converted into an SEM image.

The control device 6 includes an arithmetic processing unit, a linear motor driving amplifier, and the like, whereby the servo control system that calculates a driving force of an XY table.

As a deflection control unit 19 controls a deflection coil 21 using a laser position signal stored in the control device 6, it is possible to cause the electron beam to follow stage vibration, and to reduce an image shake caused by the stage vibration.

With the above configuration, the wafer 2 can be moved on the XY plane with respect to the sample chamber 1, and a sample can be imaged by the column 3.

Figure 2:
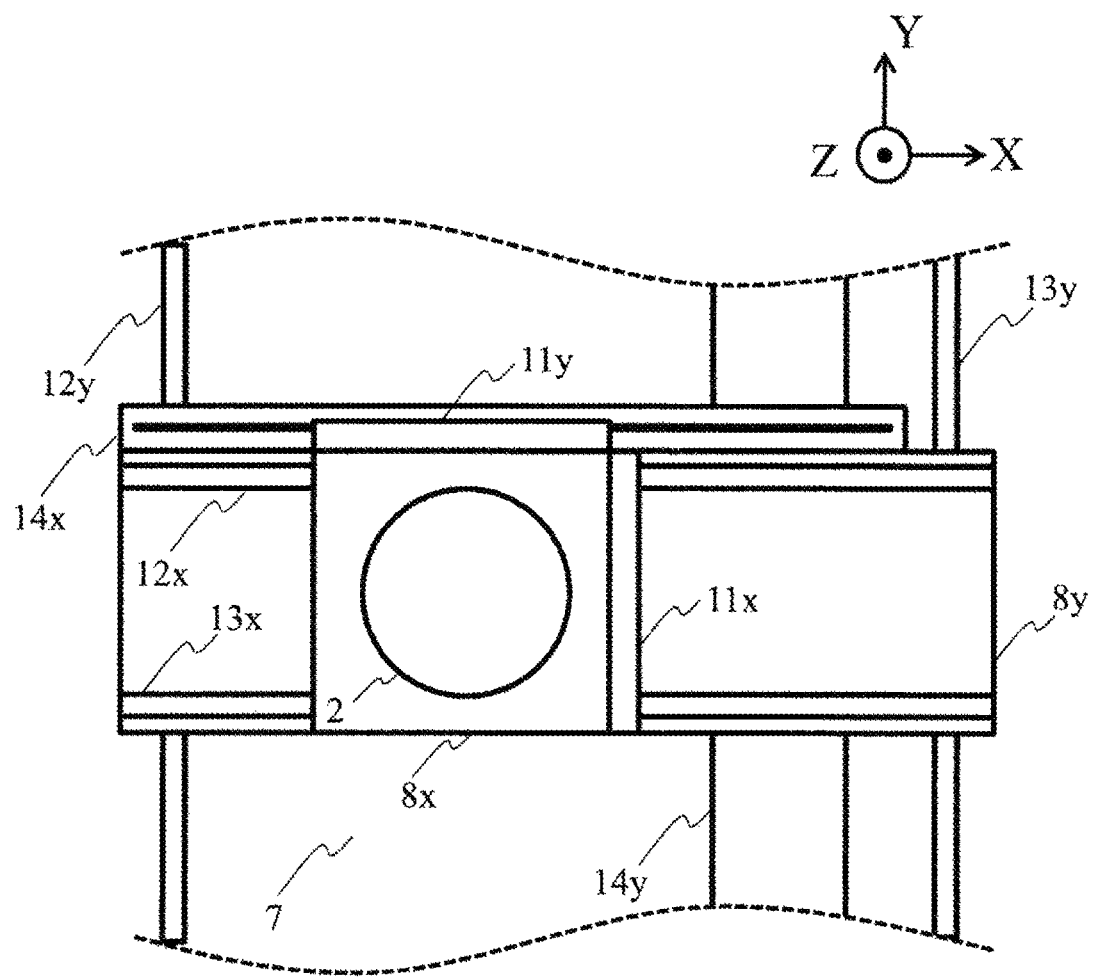
FIG. 2 is a schematic view of an XY stage mechanism as viewed from the top.

FIG. 2 is a schematic view of an XY stage mechanism as viewed from the top. On the base 7, a Y table 8y, which is freely movable in the Y direction via two Y linear guides 12y and 13y, is arranged, and a Y linear motor 14y is arranged so as to generate a thrust relatively in the Y direction. On the Y table 8y, an X table 8x, which is freely movable in the X direction via two X linear guides 12x and 13x is arranged, and an X linear motor 14x is arranged so as to generate a thrust in the X direction. As a result, the X table 8x can move in the X and Y directions with respect to the base 7 and the sample chamber 1.

The wafer 2 is placed on the X table 8x. For the arrangement of the wafer 2, a wafer holding mechanism (not illustrated) having a mechanical restraining force or a holding force such as an electrostatic force is used.

Incidentally, the linear motor is used as a drive mechanism in the present embodiment, but an actuator usable in a vacuum such as a ball screw and a piezoelectric actuator can also be used, for example. In addition, the laser interferometer is used to detect the position of the stage, but other position detection methods such as a linear scale can be used, for example.

FIG. 3 is a schematic view illustrating a state of rolling elements of the linear guide. FIG. 3(a) is a schematic view illustrating a state of rolling elements during stage movement. In this region, the stage moves while rolling elements 30 of the linear guide 12 roll. FIG. 3(b) is a schematic view illustrating a state after the stage movement. The linear guide 12 is not completely stopped immediately after the stage movement, but the rolling elements 30 are slightly displaced while being elastically deformed. In a region of FIG. 3(b), rolling friction of the linear guide behaves as a nonlinear spring, and thus, the stage is displaced about from several tens of nanometers to several hundreds of nanometers with a slow time constant of about 1 to 2 seconds.

It is desirable to image the sample immediately after the stage movement in order to improve the device throughput. However, when imaging is performed in the region of FIG. 3(b), a thrust fluctuation occurs in the linear motor accompanying elastic deformation of the linear guide. The thrust fluctuation of the linear motor causes deformation of the mirror and wafer on the table 8, which causes an image drift.

Incidentally, if a guide mechanism (such as a fluid bearing and a magnetic bearing) that does not use the rolling element such as the linear guide is used, the thrust fluctuation of the linear motor accompanying the elastic deformation of the rolling element does not occur. However, the charged particle beam device needs to irradiate a sample with a charged particle beam in a vacuum atmosphere, it is difficult to apply the fluid bearing or the magnetic bearing. Therefore, in order to improve positioning accuracy of the field of view, it is necessary to correct the image drift caused by stage deformation.

FIG. 4 is a schematic view illustrating deformation of the mirror. FIG. 4(a) is a schematic view when the mirror is not deformed. In this case, relative positional relationships between each of observation points a, b, and c on the wafer 2 and the Y mirror 11y are equal. FIG. 4(b) is a schematic view when the mirror is deformed. FIG. 4(b), when the mirror is deformed by ΔY in the Y-axis direction, a laser value on the Y-axis changes along with the deformation of the mirror, and thus, the control device 6 regards that the X table has moved by ΔY and performs servo control. When the X table has been on a desired observation point, the position deviates by ΔY from a center of the field of view of the observation point.

FIG. 5 is a schematic view illustrating deformation of the wafer. FIG. 5(a) is a schematic view when there is no wafer deformation, and FIG. 5(b) is a schematic view when there is the wafer deformation. As illustrated in FIG. 5(b), when the wafer is deformed by ΔX in the X-axis direction, a positional deviation by ΔX occurs between an electron beam for irradiation and an observation point. When the linear motor is arranged at an end of the table as in the stage of FIG. 2, the influence of the thrust fluctuation is uneven for each wafer coordinate, and thus, the deformation amount differs among the respective observation points a, b, and c on the wafer coordinates. In addition, since the deformation amount also depends on the moving amount and the moving direction of the stage, it is necessary to provide an estimation method and a correction method of a deformation amount taking these factors into consideration. When both the wafer and the mirror are deformed, an added value of the deformation amounts of the both become a field-of-view deviation of the SEM image.

FIG. 6 is a view illustrating an example of an image including no image drift and an image including the image drift. FIG. 6(a) is an SEM image including no image drift, and FIG. 6(b) is an SEM image when the image drift occurs. When there is no image drift as illustrated in FIG. 6(a), a circuit pattern 62 can be captured at a field-of-view center 63 of an SEM image 61 acquired by image processing. However, when the image drift occurs accompanying the deformation of the mirror or the wafer as illustrated in FIG. (b), the positioning accuracy of the field of view deteriorates. When the mirror and the wafer are deformed by ΔX in the X-axis direction, the amount of field-of-view deviation in the X-axis direction is ΔX.

FIG. 7 is a schematic view illustrating a relationship between a stage thrust and the image drift. FIG. 7(a) illustrates a stage thrust waveform. The stage thrust is calculated from a drive command of the linear motor which is calculated by the control device 6. FIG. 7(b) is an image drift waveform. The image drift can be measured by successively capturing a plurality of images having the same sample pattern and calculating a deviation from an initial image. FIG. 7(c) is a schematic view illustrating an image drift characteristic with respect to the stage thrust. It is possible to obtain the image drift characteristic with respect to the stage thrust shown in the following formula by measuring the stage thrust and the image drift.

$$X_{sem} = kT \qquad \text{[Formula 1]}$$

Here, Xsem is an image drift amount on the X-axis, T is a thrust of the X-axis linear motor, and k is a proportional coefficient. When the proportionality coefficient k is obtained in advance, it is possible to calculate the image drift amount Xsem during imaging using the thrust information T. The proportional coefficient k may be a polynomial.

In addition, a centroid of the stage changes depending on coordinates of a sample observation point, and the image drift characteristic with respect to the stage thrust changes. Thus, it is preferable that a correction formula of the image drift amount be a format of calculation using the stage coordinates and the thrust information.

$$Xsem = k(X,Y)T \qquad \text{[Formula 2]}$$

Here, X and Y are coordinates on the X-axis and the Y-axis at a sample observation point, and the proportionality coefficient k is a function of X and Y. Incidentally, the correction formula on the X-axis has been described herein, but the image drift amount can be calculated also for the Y-axis using the same polynomial.

Figure 8:
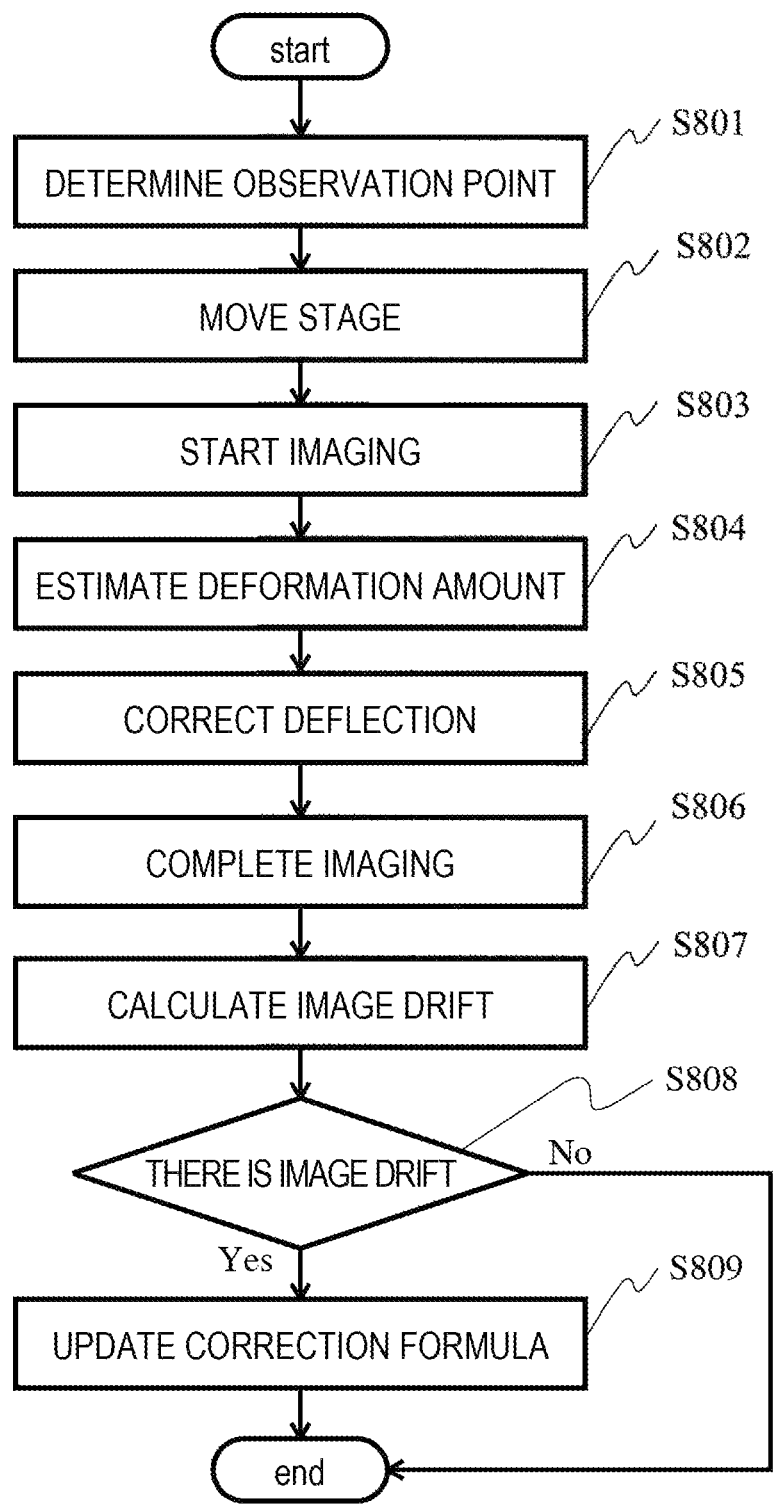
FIG. 8 is a flowchart illustrating a deflection amount correction process using a correction formula.

FIG. 8 is a flowchart illustrating a deflection amount correction process using the correction formula. In Step S801, an observation point on the wafer is determined. In Step S802, the stage is moved to position a sample pattern to be observed within the field of view of the electron microscope. In Step S803, imaging with the electron microscope is started. In Step S804, the image drift amount is estimated using the correction formula of the formula 1 or 2. In Step S805, a deflection amount of the electron optical system for correction of the image drift amount is calculated, and deflection correction is performed. In Step S806, imaging by the electron microscope is completed. In Step S807, an image drift amount during image drift correction is calculated. In Step S808, it is determined whether the image drift amount is within an allowable range. In Step S809, when the image drift amount exceeds the allowable range, the correction formula is automatically updated. When the image drift has been confirmed during manual operation by a user, a function to update the correction formula may be displayed on the GUI such that the user can execute the function at an arbitrary timing.

FIG. 13 is a view illustrating an example of a correction coefficient table (map) configured to perform the above-described irradiation position correction. In the correction coefficient table illustrated in FIG. 13, the coefficients (for example, k in Formulas 1 and 2) and a correction direction are stored for each combination of coordinates (position) and a moving direction of the stage, and a deflection signal to be supplied to a deflector is obtained by reading a moving direction (direction of the next measurement position with respect to the current measurement position (beam scanning position)) and coordinates of the next measurement position from an imaging recipe of the electron microscope stored in advance in a memory or the like in the control device 6 and substituting the thrust information of the drive mechanism required from the current measurement point to the next measurement point into a calculation formula as exemplified in Formula 2. In the correction coefficient table of FIG. 13, correction coefficient information can be registered for each region (position) when the wafer is divided into regions of i×j matrix. In addition, different coefficients can be registered in accordance with the moving directions of the stage (θ1 to θn in the example of FIG. 13). Further, not only the coefficients but also information on the correction direction can be registered in the table illustrated in FIG. 13. In addition, the moving direction of the stage may be obtained using a trigonometric function based on the current measurement position and the coordinate information of the next measurement position.

It is possible to correct the irradiation position of the beam in accordance with a stage operating condition as the table as illustrated in FIG. 13 is prepared, a region to which the next measurement position belongs is selected, a thrust is extracted from the movement information of the stage registered in advance in the recipe, and a correction amount corresponding to the movement of the stage up to the measurement position is obtained.

Second Embodiment

Figure 9:
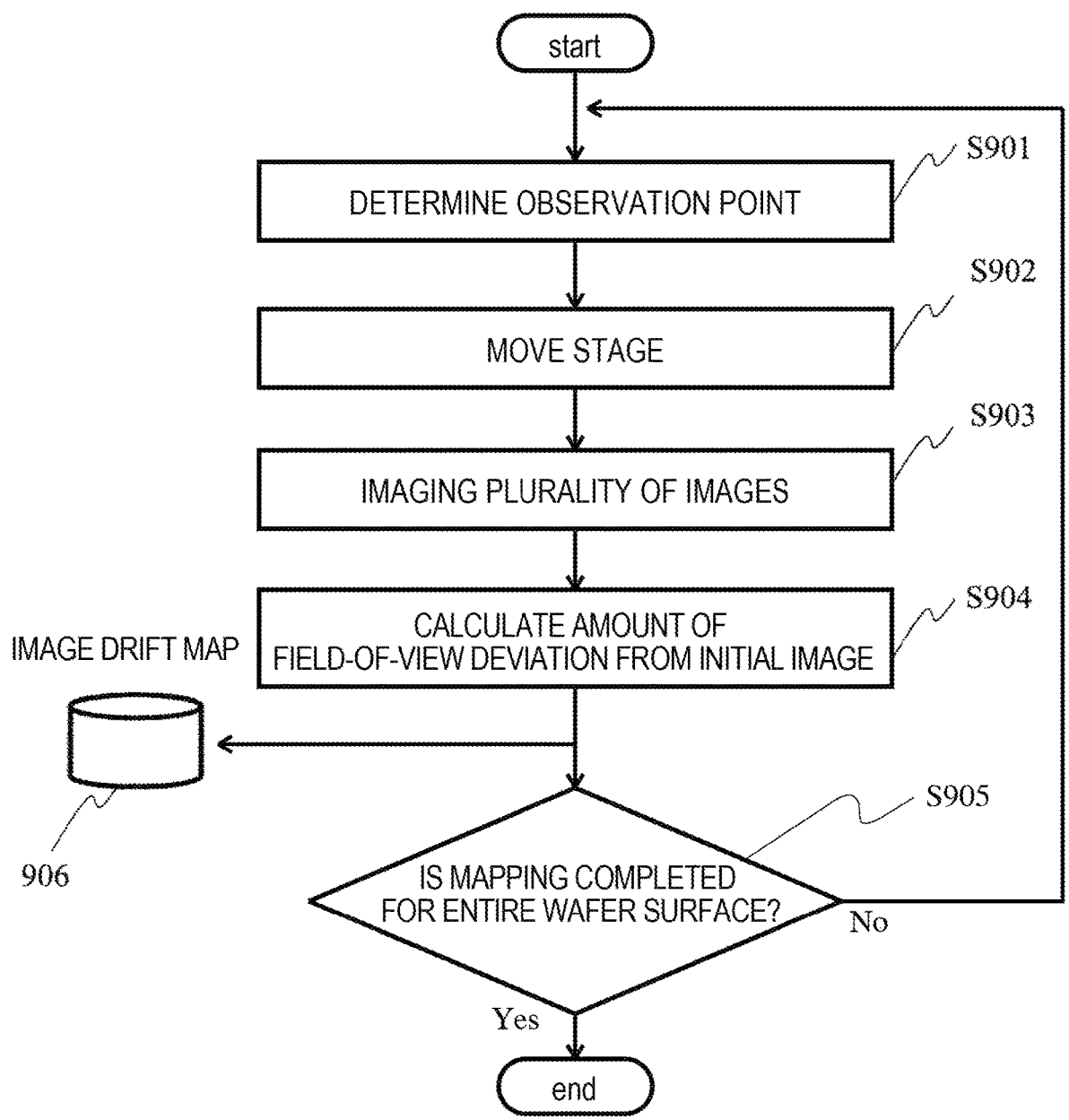
FIG. 9 is a flowchart illustrating an image drift map creation process.

A correction method using a map will be illustrated. FIG. 9 is a flowchart illustrating an image drift map creation process. In Step S901, observation points on a wafer are defined. The observation points of the wafer are set in a grid pattern at regular intervals. When there is a place where the influence of deformation is great, correction accuracy may be increased by finely dividing a grid around such coordinates.

In Step S902, the stage is moved with respect to the coordinates defined in Step S901, and a sample pattern to be observed is positioned within the field of view of the electron microscope. When the image drift amount is different depending on a stage moving distance, positioning of various stage moving distances on the same coordinates may be performed.

In Step S903, a plurality of SEM images is successively acquired after moving the stage. In Step S904, a field-of-view deviation of the sample pattern from the center of the field of view is calculated for each of the plurality of acquired images. The amount of field-of-view deviation is calculated for both the X-axis and Y-axis. A time history response (image drift amount) of the calculated field-of-view deviation amount of the sample pattern is stored in the image drift map.

In Step S905, it is determined whether mapping has been ended for the entire wafer surface. In the case of the end, mapping is completed. Otherwise, the processing returns to Step S901. When the map is acquired and the stage moving direction is reversed from that at the time of acquiring the map in the correction process, the correction may be performed by negative multiplication of the correction amount.

Figure 10:
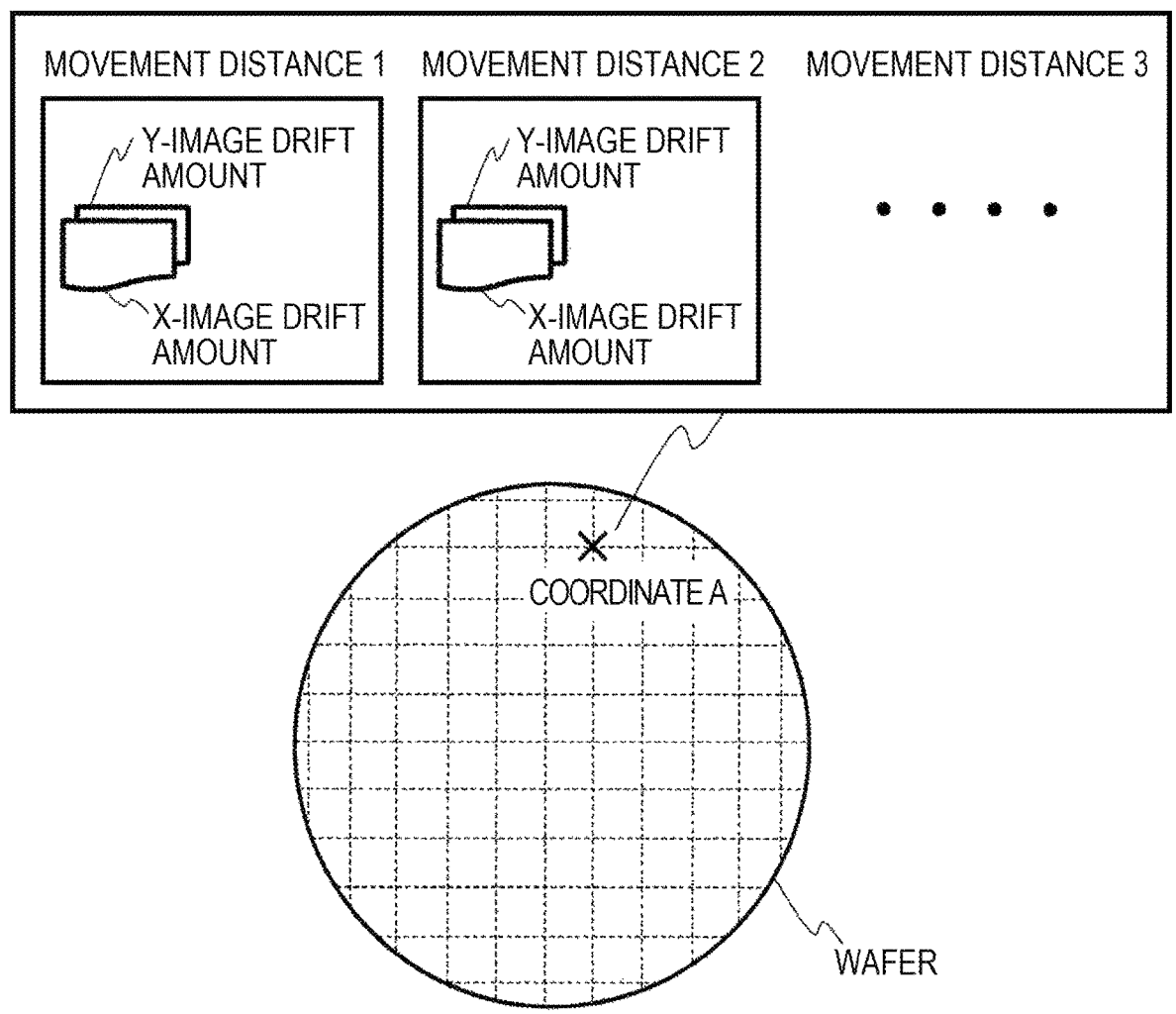
FIG. 10 is a schematic view illustrating an image drift correction map.

FIG. 10 is a schematic view illustrating an image drift correction map. Image drift amount data obtained by the map creation process of FIG. 9 is stored for each wafer coordinate. For example, the image drift amounts of the X-axis and the Y-axis corresponding to movement distances 1, 2, 3, and so on are stored for a coordinate A. When the image drift amount does not depend on the moving distance, the map may be created only for a single moving distance.

When the linear guide changes over time such as abrasion, the relationship between the stage thrust and the deformation amount changes, and thus, the image drift amount also fluctuates. In this case, it is preferable to constantly monitor the image drift amount, to notify the user of deterioration on the GUI when an effect obtained by the correction deteriorates, and to alert a maintenance time of the device. In addition, it is also preferable to display a map update button on the GUI such that the user can update the map at an arbitrary timing.

Third Embodiment

Figure 11:
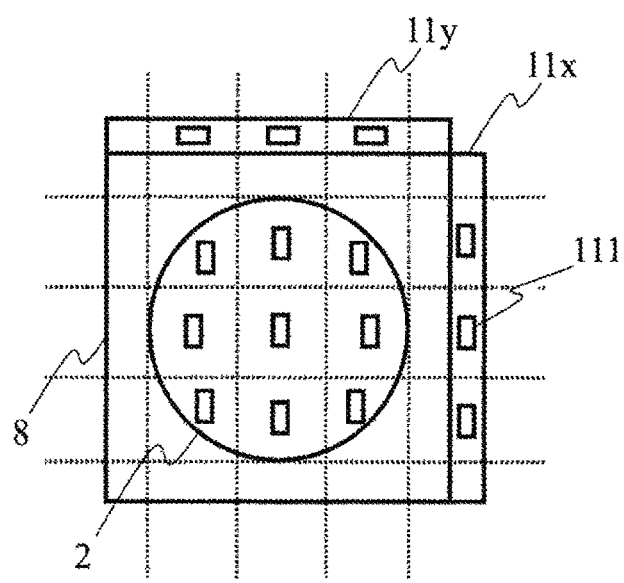
FIG. 11 is a schematic view illustrating a sensor arrangement to detect a stage deformation amount.

A correction method using a sensor that detects stage deformation will be illustrated. FIG. 11 is a schematic view illustrating a sensor arrangement to detect a stage deformation amount. A strain gauge or the like can be used as the sensor used to detect the deformation. A sensor detecting a deformation amount of a mirror can be installed on a back surface of the mirror, or the like. It is difficult to install a sensor directly on a wafer, and thus, a sensor detecting a wafer deformation amount is attached to a wafer holding mechanism to detect the wafer deformation amount equivalently. The sensor may be built in the mirror and the wafer holding mechanism, respectively.

In addition, it is possible to detect deformation for each coordinate by dividing wafer coordinates into a lattice shape and installing a plurality of sensors as illustrated in FIG. 11.

FIG. 12 is a flowchart illustrating a deflection amount correction process using the sensor. In Step S1201, an observation point on the wafer is determined. In Step S1202, the stage is moved with respect to the coordinates defined in Step S1201, and a sample pattern to be observed is positioned within the field of view of the electron microscope. In Step S1203, imaging with the electron microscope is started. In Step S1204, the deformation amount at each observation point of the mirror and the wafer is measured using a strain sensor or the like.

The relative deformation amount of the mirror and wafer is calculated using the following formula.

$$Dr = Dm - Dw \qquad \text{[Formula 3]}$$

Here, Dr is a relative deformation amount between the mirror and the wafer, Dm is a mirror deformation amount, and Dw is a wafer deformation amount. In Step S1205, a correction amount for deflection correction of the deformation amount is calculated, and the deflection correction is performed. In Step S1206, imaging at the current observation point is completed, and the stage is moved to the next measurement point in accordance with a wafer recipe.

According to the charged particle beam device configured as described above, each deformation amount of the mirror and the wafer on the table after the stage movement is estimated using a deformation amount estimation means such as the correction formula, the map, and the sensor, and the deflection amount is corrected by feeding back an estimated value of the deformation amount to a deflection control system of the electron optical system so that it is possible to acquire the high-resolution SEM image with no image disturbance such as the image drift caused by stage deformation. In addition, it is possible to perform imaging immediately after stage movement without setting a standby time for imaging, which contributes to improvement in device throughput.

REFERENCE SIGNS LIST 1 sample chamber
2 wafer
3 column
4 electron beam
5 electron gun
6 control device
7 base
8 table
10 laser interferometer
11 mirror
12, 13 linear guide
14 linear motor
17 secondary electron detector
18 image processing unit
19 deflection control unit
21 deflection coil
22 X stage
23 Y stage
30 rolling element
61 SEM image
62 circuit pattern
63 field-of-view center
111 strain sensor
906 image drift map

The invention claimed is:

1. A charged particle beam device comprising:
a sample chamber;
a sample stage arranged in the sample chamber and configured to hold a sample thereon;
a motor configured to drive the sample stage to move;
a charged particle beam source configured to release a charged particle beam;
a deflector configured to deflect the charged particle beam released from the charged particle beam source;
a focusing lens configured to focus the charged particle beam; and
a detector configured to detect secondary particles generated from irradiating a sample on the sample stage with the charged particle beam;
an image processor configured to generate an image from signals output from the detector; and
a control device configured to control the motor to drive the sample stage based on thrust information and to control the deflector based on a deflection signal,
wherein the control device is further configured to calculate the deflection signal to be supplied to the deflector based on an image drift amount,
wherein the control device is further configured to calculate the image drift amount according to a predetermined correction formula based on the thrust information for driving the sample stage and a coefficient, and
wherein the coefficient is a function of coordinates of an observation point of a sample on the sample stage.

2. The charged particle beam device according to claim 1, wherein
the control device is further configured to update the correction formula when an image drift amount determined from the image generated by the image processor exceeds an allowable range.

3. A charged particle beam device comprising:
a sample chamber;
a sample stage arranged in the sample chamber and configured to hold a sample thereon;
a motor configured to drive the sample stage to move;
a charged particle beam source configured to release a charged particle beam;
a deflector configured to deflect the charged particle beam released from the charged particle beam source;
a focusing lens configured to focus the charged particle beam;
a detector configured to detect secondary particles generated from irradiating a sample on the sample stage with the charged particle beam;
an image processor configured to generate an image from signals output from the detector; and
a control device configured to control the motor to drive the sample stage based on thrust information and to control the deflector based on a deflection signal,
wherein the control device is further configured calculate a deflection signal to be supplied to the deflector based on an image drift amount,
wherein the control device is further configured to calculate the image drift amount according to a predetermined correction formula based on the thrust information for driving the sample stage and a coefficient, and wherein the coefficient is selected from a correction map storing predetermined values of the coefficient for each combination of coordinates of observation points of a sample on the sample stage and moving directions of the sample stage.

\* \* \* \* \*